March 6, 1951 W. L. CARLSON ET AL 2,543,891

VARIABLE ULTRA HIGH FREQUENCY CIRCUITS

Filed Aug. 4, 1948

INVENTORS
WENDELL L. CARLSON &
ROBERT L. HARVEY

Philip G. Coover
ATTORNEY

Patented Mar. 6, 1951 2,543,891

UNITED STATES PATENT OFFICE 2,543,891

VARIABLE ULTRA HIGH FREQUENCY CIRCUITS

Wendell L. Carlson and Robert L. Harvey, Princeton, N. J., assignors to Radio Corporation of America, a corporation of Delaware Application August 4, 1948, Serial No. 42,528

19 Claims. (Cl. 250—36)

This invention relates generally to oscillatory circuits or structures tunable over a wide ultra-high frequency range and particularly to variable resonant circuits suitable for oscillation generators which will develop a substantially constant output energy over a wide tuning range.

For an ultra-high frequency oscillation generator it is necessary to provide a resonant circuit having distributed reactance because conventional resonant circuits consisting of lumped capacitance and inductance cannot be made to behave at frequencies above 200 megacycles (mc.). As oscillation generator suitable for the frequency range between approximately 500 to 1,000 mc. should meet various requirements. It is very desirable to be able to tune the generator over a wide frequency range. Sliding contacts as a means of tuning the resonant circuit are a source of erratic operation at ultra high frequencies because a high frequency current will follow the path of least impedance regardless of the magnitude of the contact resistance. Thus, another requirement of an ultra-high frequency oscillation generator is that it should be tunable without sliding contacts. Finally, the tuning of the generator should be accomplished by uni-control means.

Wide range tuned circuits of the type herein considered have been disclosed by Eduard Karplus in an article published in Proceedings IRE, vol. 33, pages 426 to 441, July 1945. On pages 437 to 439 of this paper Karplus discloses a "cylinder circuit" which consists of two concentric split cylinders, the outer one of which is connected to the electrodes of the oscillator tube while the inner cylinder is rotatable to vary the capacitance of the resonant structure. This resonant circuit however, is not a complete solution of the problems involved. Thus, the frequency range which can be covered with an oscillator employing the Karplus cylinder circuit is not as wide as is required for some applications. Furthermore, the oscillator is not very stable with respect to variations of the anode voltage supply particularly at the high frequency end of the tuning range. Finally, the amount of feed back depends on the frequency adjustment and therefore the output energy of the generator is not constant over the entire frequency range. This is due to the fact that the feed back is too large at the high frequency end of the tuning range which in turn limits the tuning range and makes the generator unstable with respect to voltage variations.

It is the principal object of the present invention, therefore, to provide novel resonant circuits or structures tunable over the ultra-high frequency range between approximately 500 and 1,000 megacycles.

Another object of the invention is to provide an oscillation generator including a resonant structure having distributed reactance and where the tuning capacitance and a coupling capacitance can be varied substantially simultaneously to maintain the feed back of the oscillation generator substantially constant over a wide ultra-high frequency range by automatically decoupling the oscillator tube and the resonant structure at the high frequency end of the tuning range.

A further object of the invention is to provide an ultra-high frequency oscillation generator including a resonant structure possessing substantially distributed reactance only and tunable over an ultra-high frequency range where the generator has greater stability with respect to variations of the anode supply voltage than previously known ultra-high frequency generators.

The fundamental components of any oscillation generator usually include an amplifier device such as electron discharge tubes, such as a triode having a cathode, a control member and an anode, and a resonant circuit including a variable capacitance element for tuning the circuit over a predetermined frequency range. One terminal of the resonant circuit is connected to the anode while its other terminal is coupled to the control member or grid by a grid coupling capacitance element. A source of voltage is connected between the cathode and through the resonant circuit to the anode for energizing the electron discharge tube. In accordance with the present invention unicontrol means is provided for substantially simultaneously increasing or decreasing the capacitance of the two elements. In other words, the grid coupling capacitance element is varied simultaneously and in the same sense as the tuning capacitance element. This will increase the feed back coupling between the control grid and the circuit when the resonant circuit is tuned to a lower resonant frequency while the feed back is decreased at the high frequency end of the tuning range.

In accordance with the present invention various resonant structures may be provided wherein the resonant frequency of the structure is varied simultaneously with a grid coupling capacitance element. The resonant structure may consist of an outer stationary cylinder having a slot parallel to its longitudinal axis wherein a separate cylindrical portion is disposed. This structure is tuned by a rotatable inner cylinder which is also slotted. Alternatively, the structure may be tuned by sliding a dielectric core into the outer cylinder. The control grid of the electron tube is connected to the cylindrical portion while the anode is connected to a high impedance point on the outer cylinder.

The novel features that are considered characteristic of this invention are set forth with particularity in the appended claims. The invention itself, however, both as to its organization and method of operation, as well as additional objects and advantages thereof, will best be understood from the following description when read in connection with accompanying drawing, in which:

Figures 1, 2, 3, 4, 5, 6, 7, 8:
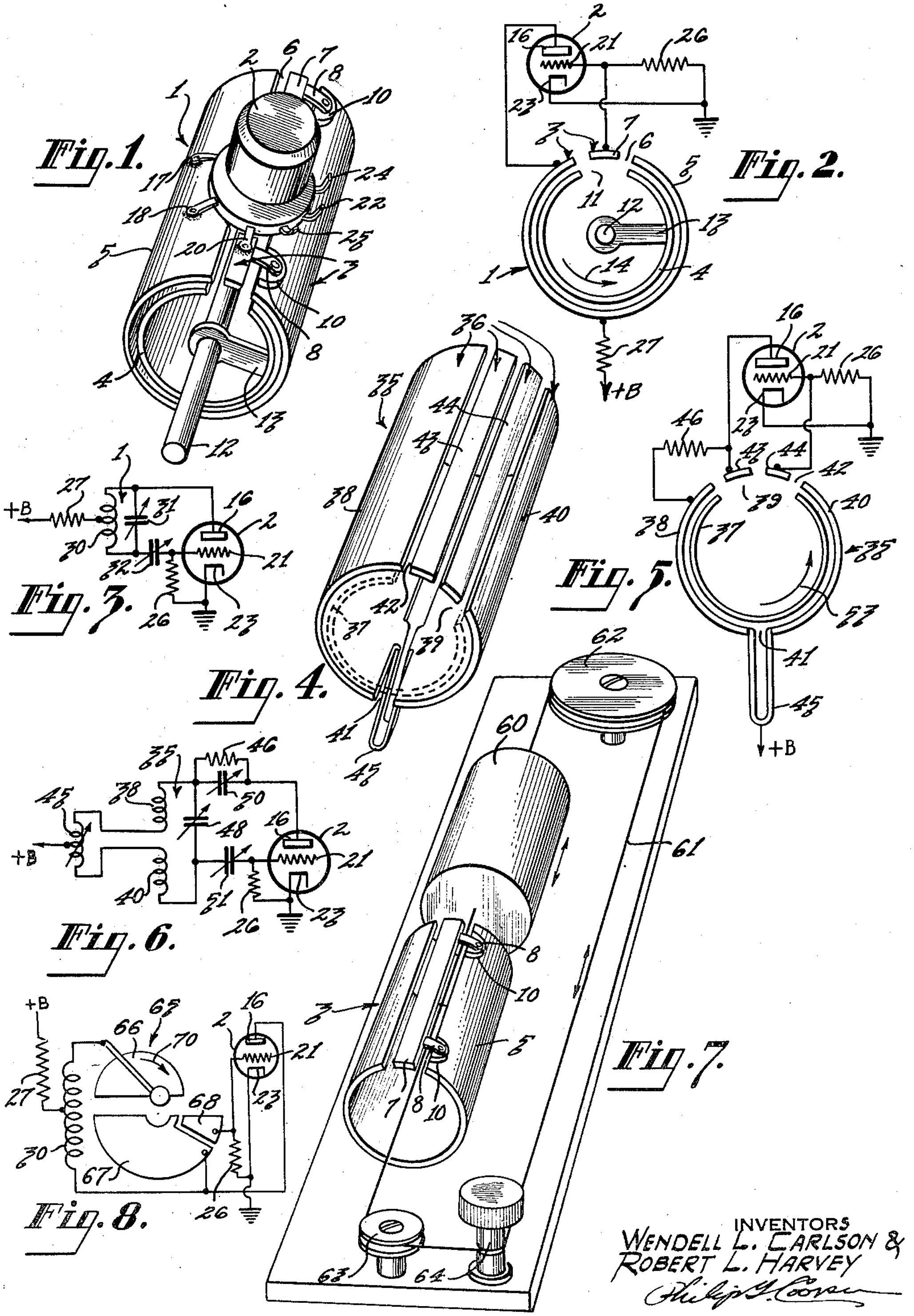
Fig. 1 is a view in perspective of an oscillation generator embodying the present invention.
Fig. 2 is a schematic end view of the generator of Fig. 1.
Fig. 3 is the equivalent circuit diagram of the generator of Fig. 1.
Fig. 4 is a view in perspective of a modified resonant circuit or structure in accordance with the invention.
Fig. 5 is a schematic end view of the structure of Fig. 4 arranged as an oscillation generator.
Fig. 6 is the equivalent circuit diagram of the oscillator of Fig. 5.
Fig. 7 is a view in perspective of another modification of the resonant structure of Fig. 1 which may be tuned by a dielectric core.
Fig. 8 is a schematic circuit diagram of an oscillator in accordance with the present invention.

Referring now to Figs. 1 and 2 there is illustrated an ultra-high frequency oscillation generator in accordance with the present invention. The generator comprises a resonant circuit or structure 1 and a spaced-discharge tube or amplifier device 2 which may be a triode as illustrated in Fig. 2. Resonant circuit 1 includes a stator structure 3 and rotor 4. Stator 3 comprises stationary cylinder 5 having a slot 6 arranged parallel to its longitudinal axis. Stationary cylindrical portion 7 is disposed within slot 6 and forms a continuation of the cylindrical surface of cylinder 5. Cylindrical portion 7 is connected to cylinder 5 by straps 8 which are insulated from cylinder 5 through suitable insulating separators which may consist of mica sheets 10. Thus, cylindrical portion 7 is electrically insulated from cylinder 5.

Rortor 4 also consists of a cylinder having a slot 11 which is preferably coextensive with slot 6 in outer cylinder 5. Cylindrical rotor 4 is concentric with outer cylinder 5 and is rotatable relatively to stator 3. To this end rotor 4 is secured to shaft 12 by connecting links 13. Shaft 12 may be mounted in a suitable bearing to rotate rotor 4 in the direction shown by arrow 14.

Outer cylinder 5, cylindrical portion 7 and rotor 4 may consist of a metal having good electric conductivity such as copper or silver. Alternatively, stator 3 and rotor 4 may be plated or otherwise covered with a metal of high electric conductivity. Shaft 12 and connecting link 13 preferably consist of an insulating material although shaft 12 may also consist of a metal.

Stator 3 consisting of outer cylinder 5 and cylindrical portion 7 and rotor 4 constitute a resonant circuit having substantially only distributed reactance. The inductance of the resonant circuit is represented mainly by cylinder 5. A fixed capacitance is formed by the edge capacitance between cylinder 5 and cylindrical portion 7 and by the capacitance formed between straps 8 and cylinder 5. When rotor 4 is rotated in the direction of arrow 14, the capacitance between cylindrical portion 7 and rotor 4 is first increased. When rotor 4 is further rotated the capacitance between outer cylinder 5 and rotor 4 and thus the capacitance between cylindrical portion 7 and outer cylinder 5 is then increased.

Outer cylinder 5 has a voltage node opposite slot 6 and voltage antinodes adjacent slot 6. In accordance with the present invention plate 16 of triode 2 is connected to a voltage antinode of outer cylinder 5 which forms a high impedance point. Preferably, triode 2 is of the 6F4 type, the base portion of which includes a plurality of contact prongs as shown in Fig. 1. Prongs 17, 18 are connected together and make contact with anode 16 of triode 2; their free ends are connected or soldered to high impedance points or voltage antinodes of outer cylinder 5. Two further prongs 20, of which only one is visible in Fig. 1, are connected together and lead to control grid 21 of triode 2. Prongs 20 extend from opposite points of the tube base and are connected to cylindrical portion 7. Prong 22 is connected to cathode 23 of the triode and prongs 24, 25 lead to the cathode filament.

As illustrated in Fig. 2 cathode 23 is grounded and control grid 21 is connected to ground through grid leak resistor 26. A point of outer cylinder 5 which is opposite slot 6 and which has a voltage node is connected to the anode voltage supply indicated at +B through resistor 27, thereby supplying a suitable positive voltage to anode 16 through cylinder 5 and prongs 17 or 18.

The oscillation generator of Figs. 1 and 2 will oscillate within a frequency range between approximately 500 and 1000 mc. However, the exact tuning range depends on the particular tube and its interelectrode capacitance as well as on the dimensions of resonant structure 1. When the diameter of cylinder 5 is increased, the resonant frequency of the structure decreases. On the other hand, when the length of cylinder 5 is increased, the resonant frequency of the structure is higher. Control grid 21 which is connected to cylindrical portion 7 is electrically insulated from the direct current supplied to cylinder 5 and anode 16.

In the position illustrated in Fig. 2, resonant structure 1 has its highest resonant frequency. When rotor 4 is rotated in the direction of arrow 14 the resonant frequency of the structure will decrease. At first, the grid coupling capacitance which is the capacitance between cylindrical portion 7 and rotor 4 is increased. This will increase the coupling of resonant structure 1 to control grid 21 and thereby to triode 2. This, in turn, will decrease the resonant frequency developed by the oscillation generator. Further rotation of rotor 4 will increase the capacitance across the high impedance points or voltage antinodes of outer cylinder 5. Consequently, the tuned circuit represented by resonant structure 1 will now have an increased capacitance which will further decrease the resonant frequency developed by the oscillation generator.

The equivalent circuit of the oscillation generator of Figs. 1 and 2 is shown in Fig. 3. Resonant structure 1 has been represented as a conventional tuned circuit consisting of coil 30 and variable capacitor 31. The midpoint of coil 30 is connected to +B through resistor 27. One terminal of resonant circuit 1 is connected to anode 16 of triode 2. The other terminal of resonant circuit 1 is coupled to control grid 21 through variable grid coupling capacitor 32. Cathode 23 is grounded and control grid 21 is connected to ground through grid leak resistor 26.

It will now be evident that coil 30 represents the distributed inductance of outer cylinder 5 which remains substantially constant when rotor 4 is rotated. Variable tuning capacitor 31 represents mainly the capacitance between the high impedance points of outer cylinder 5 and rotor 4. Variable grid coupling capacitor 32 represents the capacitance between cylindrical portion 7 and rotor 4 and also the small fixed capacitance between cylindrical portion 7 and outer cylinder 5. It will accordingly be seen that resonant structure 1 includes a variable tuning capacitor and a variable grid coupling capacitor which are varied in unison by rotor 4 to increase or decrease substantially simultaneously the capacitance of capacitors 31 and 32. Accordingly, at the high frequency end of the tuning range triode 2 is largely decoupled from resonant structure 1 because the fixed grid capacitance can be made very small. As rotor 4 is rotated the coupling between resonant structure 1 and triode 2 is increased and at the same time the resonant frequency of resonant structure 1 is decreased.

The effect of this arrangement is that variable grid coupling capacitor 32 maintains the regeneration substantially constant over the entire tuning range and thus the output energy developed by the oscillation generator will be substantially constant over the entire range. Since less feedback is developed at the high frequency end of the tuning range, it has been determined that the tuning range is extended approximately 20 per cent particularly at the high frequency end over that which may be obtained with previously known arrangements.

Another advantage of the oscillation generator of the invention is that the generator exhibits greater stability with respect to variations of the anode voltage supply. This is mainly due to the fact that resonant structure 1 and tube 2 are relatively decoupled at the high frequency end of the tuning range. Furthermore, the very low fixed grid coupling capacitance which is determined by the edge capacitance between cylinder 5 and cylindrical portion 7 and by the capacitance between straps 8 and cylinder 5 will reduce the capacitance loading of triode 2 to a minimum.

The oscillation generator illustrated in Fig. 3 may be considered as a Hartley oscillator and its operation is too well known to require further explanation. It is, of course, necessary to take into consideration the interelectrode capacitance between anode 16 and cathode 23 and between grid 21 and cathode 23. These interelectrode capacitances may be required to furnish at least a portion of the feedback as pointed out by Karplus. When rotor 4 rotates, the position of the voltage node on cylinder 5 will move somewhat. However, this will not adversely affect the operation of the oscillator when resistor 27 is used.

It has already been pointed out that the exact frequency range of the oscillation generator depends on the properties of the tube used and also on the dimensions of resonant structure 1. The clearance between rotor 4 and stator 3 is also very important. The smaller the gap between stator 3 and rotor 4, the larger will be the tuning range but it is, of course, important that there should be no electrical contact between the two.

Resonant structure 1 will have a large radiation resistance and it is therefore desirable that the structure be properly shielded to prevent radiation losses. Depending on the construction of the tube base it may be necessary to cut away a portion of rotor 4 to permit the rotor to move through its desired angle of rotation in case the tube base extends into cylinder 5.

It will be understood that resonant structure 1 may be utilized for any purpose for which resonant circuits are required. Thus, it is feasible to connect the high impedance point of cylinder 5 to the anode of a previous tube while cylindrical portion 7 may be connected to the control grid of the following tube thereby to provide a tuned transmission channel.

In Figs. 4 and 5 there is shown a modified resonant structure 35 in accordance with the present invention which may also be used as an oscillation generator. Resonant structure 35 comprises stator structure 36 and rotor 37. Stator 36 consists of two substantially semicylindrical members 38 and 40 spaced to form a narrow slot 41 and a wide slot 42 which extend parallel to the longitudinal axis of members 38, 40. Two cylindrical portions 43, 44 are disposed in the wide slot 42 and form a continuation of the cylindrical surface defined by members 38, 40. Cylindrical portion 43, 44 are insulated from each other and from members 38, 40. Inductive loop 45 connects members 38, 40 across slot 41. Rotor 37 is concentric with stator 36 and has a slot 39 which is substantially coextensive with and parallel to slot 42 between cylindrical members 38, 40.

As illustrated in Fig. 5 the anode 16 of triode 2 is connected to cylindrical portion 43 and control grid 21 is connected to cylindrical portion 44. Semicylindrical member 38 is connected to anode 16 through resistor 46 and the anode voltage supply +B is connected to inductive loop 45. However, it is also feasible to connect the voltage supply +B directly to anode 16 through a suitable resistor.

The resonant circuit of Figs. 4 and 5 operates in a manner similar to that of Figs. 1 and 2. The equivalent circuit of the oscillation generator of Fig. 5 is shown in Fig. 6. Resonant structure 35 consists of three series connected coils designated 38, 45 and 40 corresponding respectively to semicylindrical member 38, inductive loop 35 and semicylindrical member 40. Coils 38, 45, 40 are tuned by variable capacitor 48. One terminal of tuned circuit 35 is coupled to anode 16 through anode coupling capacitor 50 bypassed by resistor 46. The other terminal of resonant circuit 35 is coupled to control grid 21 through grid coupling capacitor 51. Anode coupling capacitor 50 represents the variable capacitance between cylindrical portion 43 and rotor 37. Similarly, grid coupling capacitor 51 represents the variable capacitance between cylindrical portion 44 and rotor 37. Tuning capacitor 48 represents the variable capacitance between the high impedance points of semicylindrical members 38, 40 and rotor 37. Accordingly, capacitors 48, 50 and 51 are varied in unison and in the same sense by rotation of rotor 37 in the direction of arrow 53.

When rotor 37 is rotated in the direction of arrow 53 the capacitance of capacitor 51 will first be increased, then that of capacitor 50 and finally that of capacitor 48. Further rotation of rotor 37 will gradually connect inductance loop 45 into the resonant circuit to render it effective. Inductance loop 45 previously has been effectively short circuited by the rotor. Resonant structure 35 accordingly has a wider tuning range than that of resonant structure 1 because it includes an additional inductance loop which may be rendered effective or which may be short circuited by rotation of rotor 37. Both anode 16 and control grid 21 of triode 2 are loosely coupled at the high frequency end of the tuning range to resonant structure 35. Resonant structure 35 may consist of a high conductivity metal or may be plated or otherwise covered with such a metal. Resonant structure 35 may be utilized in connection with an oscillation generator as illustrated in Fig. 5 or it may be utilized as a resonant circuit.

Resonant structure 35 of Fig. 4 may be modified by omitting cylindrical portion 43. Such a resonant circuit will resemble circuit 1 with the addition of inductive loop 45. Alternatively, inductive loop 45 may be omitted from resonant structure 35 and semicylindrical members 38 and 40 may be directly connected.

Fig. 7 illustrates a modification of resonant structure 1 of Figs. 1 and 2. The resonant circuit comprises stator 3 which consists of cylinder 5 and cylindrical portion 7 which may be identical with that of Fig. 1. However, stator 3 is tuned by dielectric core 60 which consists of a material having a high dielectric constant which is preferably larger than 1,000. Certain strontium, barium or calcium titanates have delectric constants of the order of 4,000 and have disclosed, for example, in the patents to Wainer, 2,399,982, 2,436,839 and 2,402,518.

Dielectric core 60 is arranged slidable with respect to cylinder 5 and cylindrical portion 7. To this end dielectric core 60 may be moved by string 61 guided by idler pulley 62, 63 and over stud 64 whih may be rotated by knob 65. When dielectric core is moved into cylinder 5, it will simultaneously increase the capacitance between core 60 and cylinder 5 and also between the core and cylindrical portion 7. This will vary the resonant frequency of stator 3 in the manner previously explained.

Core 60 preferably fits closely within cylinder 5 and cylindrical portion 7. It will not affect the operation of the resonant structure if the core touches one edge of cylinder 5. The tuning range of the resonant structure of Fig. 7 is smaller than that of the resonant structure of Figs. 1 and 2. However, the tuning range may be increased by providing a smaller tolerance between dielectric core 60 and cylinder 5 than is possible between stator 3 and rotor 4 of the resonant structure of Fig. 1. Dielectric core 60 will resonate at a frequency which is determined by its dimensions or size. It is to be understood that core 60 should not be resonant within the frequency range to which the resonant circuit of Fig. 7 may be tuned. However, the resonant frequency of core 60 may easily be changed by varying its size or its configuration.

The oscillation generator of the invention may also take the form illustrated in Fig. 8. The oscillator of Fig. 8 which is similar to the generator shown in Fig. 3, includes a triode 2 having anode 16, control grid 21 and cathode 23 which is grounded as shown. A resonant circuit is provided which consists of lumped inductance and capacitance. Thus the resonant circuit comprises coil 30 and variable capacitor assembly 65. Capacitor assembly 65 includes rotor 66, main stator plate 67 and a small stator plate 68 which is insulated from stator plate 67. The midpoint of coil 30 is connected to anode voltage supply +B through resistor 27. One terminal of coil 30 is connected to rotor 66 while the other terminal of the coil is connected to main stator plate 67 and anode 16 .The small stator plate 16 is connected to control grid 21 which is grounded through resistor 26.

The oscillation generator of Fig. 8 functions as a Hartley oscillator. When rotor 66 is rotated in the direction of arrow 70, the capacitance represented by plate 68 is first inceased by the rotor thereby to increase the grid coupling capacitance. Further rotation of rotor 66 will increase the capacitance represented by stator plate 67 to decrease the resonant frequency of the circuit represented by coil 30 and tuning capacitance 67. The oscillation generator of Fig. 8 operates otherwise in the manner described in connection with Fig. 3, the main difference being that the resonant circuit comprises lumped reactance instead of distributed reactance.

There have thus been described various resonant circuits or structures which are tunable over a wide ultra-high frequency range. The resonant structures may be used in connection with an oscillation generator or in a tuned transmission channel and have a variable tuning capacitor and a variable grid coupling capacitor. Accordingly, the feedback is increased at the high frequency end of the tuning range thereby to decouple the resonant structure of the tube. This will extend the tuning range particularly at the high frequency end, it will provide greater stability of the generator with respect to variations of the anode voltage supply and furthermore the oscillator output energy will be substantially constant over the entire tuning range. Finally, the fixed grid coupling capacitance is very small which also permits an extension of the tuning range at the high frequency end because the feedback at that frequency does not become excessive. A modification of the resonant structure of the invention comprises, in addition to the variable grid coupling capacitor and the variable tuning capacitor, a variable anode coupling capacitor and an inductance loop which may be rendered effective by unicontrol means. The resonant stucture may be tuned by a rotatable split cylinder or alternatively by axially moving a dielectric core relatively to the resonant structure.

What is claimed is:

1. An oscillation generator comprising an amplifier having a cathode, a control member and an anode, a resonant circuit including means for tuning said circuit over a predetermined frequency range, a coupling capacitance element for coupling said circuit to said member, a circuit connection between said circuit and said anode, a source of voltage coupled to said amplifier, and unicontrol means for increasing the capacitance of said element substantially simultaneously with a reduction of the resonant frequency of said circuit, thereby to increase the coupling between said amplifier and said circuit.

2. An oscillation generator comprising a tube having a cathode, a control grid and an anode, a resonant circuit including a capacitance element for tuning said circuit over a predetermined frequency range, a grid coupling capacitance element for coupling one terminal of said circuit to said grid, the other terminal of said circuit being connected to said anode, a source of voltage connected between said cathode and said circuit, and unicontrol means for substantially simultaneously increasing or decreasing the capacitance of said elements, thereby to increase the coupling between said control grd and said circuit when the frequency of oscillations developed by said generator is reduced.

3. An oscillation generator comprising an amplifier having a cathode, a control member and an anode, a resonant circuit including a capacitance element for tuning said circuit over a predetermined frequency range, a first coupling capacitance element for coupling one terminal of said circuit to said member, a second coupling capacitance element for coupling the other terminal of said circuit to said anode, a source of voltage connected between said cathode and said anode, and unicontrol means for substantially simultaneously increasing or decreasing the capacitance of said elements, thereby to increase the coupling between said amplifier and said circuit when the frequency of oscillations developed by said generator is reduced.

4. An oscillation generator comprising an amplifier having a cathode, a control member and an anode, a resonant circuit including a capacitance element and an inductance element for tuning said circuit over a predetermined frequency range, a first coupling capacitance element for coupling one terminal of said circuit to said member, a second coupling capacitance element for coupling the other terminal of said circuit to said anode, a source of voltage connected between said cathode and said anode, and unicontrol means for substantially simultaneously increasing or decreasing the capacitance of said capacitance elements and for varying the inductance of said inductance element thereby to increase the coupling between said amplifier and said circuit when the frequency of oscillations developed by said generator is reduced.

5. An oscillatory structure tunable over an ultra-high frequency range comprising a cylinder having a slot, a conductive element disposed within said slot and insulated from said cylinder, and a member movable relatively to said cylinder and said element to vary simultaneously the capacitance between said member and said cylinder and between said member and said element.

6. An oscillatory structure tunable over an ultra-high frequency range comprising a stationary cylinder slotted parallel to its longitudinal axis, a stationary element disposed within the slot of said cylinder and insulated therefrom, and a member movable relatively to said cylinder and said element to vary simultaneously the capacitance between said member and said cylinder and between said member and said cylindrical portion.

7. An oscillatory structure tunable over an ultra-high frequency range comprising an outer cylinder having a slot, an inner cylinder disposed within said outer cylinder and concentric therewith, said inner cylinder having a slot and being rotatable relatively to said outer cylinder, and a conductive element disposed within said slot in said outer cylinder and insulated from said cylinders.

8. An oscillatory structure tunable over an ultra-high frequency range comprising a stationary outer cylinder slotted parallel to its longitudinal axis, an inner cylinder disposed within said outer cylinder and concentric therewith, said inner cylinder having a slot parallel to that of said outer cylinder and being rotatable relatively to said outer cylinder, and a conductive element disposed within said slot in said outer cylinder and insulated from said cylinders.

9. An oscillation generator comprising an amplifier having a cathode, a control member and an anode, a resonant structure including an outer cylinder slotted parallel to its longitudinal axis, an inner cylinder having a slot and disposed within said outer cylinder and concentric therewith, a conductive element disposed within said slot in said outer cylinder and insulated from said cylinders, said control member being connected to said element, said anode being connected to a high impedance point of one of said cylinders, and a voltage source connected between said anode and said cathode, one of said cylinders being rotatable with respect to the other one of said cylinders to vary simultaneously the coupling capacitance between one of said cylinders and said element and the tuning capacitance between said inner cylinder and said outer cylinder.

10. An oscillation generator comprising an amplifier having a cathode, a control member and an anode, a resonant structure including an outer stationary cylinder slotted parallel to its longitudinal axis, a stationary cylindrical portion disposed within the slot of said outer cylinder and insulated therefrom, an inner cylinder having a slot and disposed within said outer cylinder and concentric therewith, said control member being connected to said cylindrical portion, said anode being connected to a high impedance point of said outer cylinder, and a voltage source connected substantially between the voltage node of said outer cylinder and said cathode, said inner cylinder being rotatable to vary simultaneously and in the same sense the coupling capacitance between said inner cylinder and said cylindrical portion and the tuning capacitance between said inner cylinder and said outer cylinder.

11. A resonant structure tunable over an ultra-high frequency range and comprising an outer cylinder having a slot, an inner cylinder disposed within said outer cylinder and concentric therewith, said inner cylinder having a slot, and two conductive elements disposed within one of said slots and insulated mutually and from said cylinders, said inner cylinder being rotatable with respect to said outer cylinder to vary the resonant frequency of said structure.

12. A resonant structure tunable over an ultra-high frequency range and comprising an outer stationary cylinder having a slot parallel to its longitudinal axis, two stationary cylindrical portions disposed in parallel relationship within said slot and insulated mutually and from said outer cylinder, an inner cylinder disposed within said outer cylinder and concentric therewith, said inner cylinder having a slot substantially coextensive with the slot in said outer cylinder, said inner cylinder being rotatable with respect to said outer cylinder to vary the resonant frequency of said structure.

13. An ultra-high frequency oscillatory circuit comprising a stator structure consisting of two substantially semicylindrical members having a first and a second slot between them, a cylindrical portion disposed within said second slot, said portion being insulated from said members, an inductive loop connecting said members across said first slot, and a rotor consisting of a cylinder rotatably disposed with respect to said members and portion, said cylinder being provided with a slot, whereby rotation of said rotor will tune said circuit over a predetermined wide tuning range.

14. An ultra-high frequency oscillatory circuit comprising a stator structure consisting of two substantially semicylindrical members having a first narrow slot and a second wide slot between them to two cylindrical portions disposed in parallel relationship within said second slot, said portions being insulated from each other and from said members, an inductive loop connecting said members across said first slot, and a rotor consisting of a cylinder rotatably disposed with respect to said members and portions, said cylinder being provided with a slot substantially coextensive with said second slot, whereby rotation of said rotor will tune said circuit over a predetermined wide tuning range.

15. An ultra-high frequency oscillatory circuit comprising a stator structure consisting of two substantially semicylindrical stationary members having a first narrow slot and a second wide slot between them, said slots extending parallel to the longitudinal axis of said members and two stationary cylindrical portions disposed in parallel relationship within said second slot, said portions being insulated from each other and from said members, an inductive loop connecting said members across said first slot, and a rotor consisting of an inner cylinder rotatably disposed within said members and portions, said inner cylinder being provided with a slot substantially parallel to and coextensive with said second slot, whereby rotation of said rotor will tune said circuit over a predetermined wide tuning range.

16. An oscillation generator comprising an amplifier having a cathode, a control member and an anode, a resonant circuit consisting of a stator structure and a rotor, said stator structure consisting of two substantially semicylindrical members having a first narrow slot and a second wide slot between them, and two conductive portions disposed in parallel relationship within said second slot, said portions being insulated from each other and from said members, an inductance loop connecting said members across said first slot, said rotor consisting of a cylinder rotatably disposed within said stator structure and provided with a slot coextensive with said second slot, said anode being connected to one of said portions, said control member being connected to the other one of said portions, and a source of voltage connected between said cathode and said anode, whereby rotation of said rotor will vary the capacitance between said rotor and said portions and the inductance represented by said inductance loop to vary simultaneously the resonant frequency of said circuit and the coupling capacitances between said circuit and said control member and between said circuit and said anode.

17. An oscillation generator comprising an amplifier having a cathode, a control member and an anode, a resonant circuit consisting of a stator structure and a rotor, said stator structure consisting of two substantially semicylindrical members having a first narrow slot and a second wide slot between them and parallel to their longitudinal axis, and two cylindrical portions disposed in parallel relationship within said second slot, said portions being insulated from each other and from said members, an inductance loop connecting said members across said first slot, said rotor consisting of an inner cylinder rotatably disposed within said stator structure and provided with a slot coextensive with said second slot, said anode being connected to one of said cylindrical portions, said control member being connected to the other one of said cylindrical portions, a conductive impedance element connected between one of said semicylindrical members and said anode, and a source of voltage connected between said cathode and said inductance loop, whereby rotation of said rotor will vary the capacitance between said rotor and said cylindrical portions and the inductance represented by said inductance loop to vary simultaneously the resonant frequency of said circuit and the coupling capacitances between said circuit and said control member and between said circuit and said anode.

18. An ultra-high frequency oscillatory circuit comprising a cylinder having a slot, a conductive element disposed within said slot and insulated from said cylinder, and a dielectric core movable with respect to said cylinder and said element to vary simultaneously the capacitance between said core and said cylinder and between said core and said element.

19. An ultra-high frequency oscillatory circuit comprising a cylinder having a slot extending parallel to its longitudinal axis, a cylindrical portion disposed within said slot and insulated from said cylinder, and a core having a high dielectric constant slidable within said cylinder and said portion to vary simultaneously the capacitance between said core and said cylinder and between said core and said portion.

WENDELL L. CARLSON.
ROBERT L. HARVEY.

REFERENCES CITED

The following references are of record in the file of this patent:

UNITED STATES PATENTS

| Number | Name | Date |
|---|---|---|
| 1,704,071 | Austin | Mar. 5, 1929 |
| 2,120,518 | Dreyer | June 14, 1938 |
| 2,390,009 | Scott | Nov. 27, 1945 |

Certificate of Correction

Patent No. 2,543,891

March 6, 1951

WENDELL L. CARLSON ET AL.

It is hereby certified that error appears in the printed specification of the above numbered patent requiring correction as follows:

Column 3, line 54, for "Rortor 4" read *Rotor 4*; column 7, line 34, for the words "have disclosed" read *have been disclosed*; line 35, for the patent number "2,399,982" read *2,399,082*; line 41, for "whih" read *which*; column 9, line 4, for "grd" read *grid*; column 11, line 4, for "to two" read *and two*; column 12, line 58, list of references cited, for "Scott" read *Stott*;

and that the said Letters Patent should be read as corrected above, so that the same may conform to the record of the case in the Patent Office.

Signed and sealed this 19th day of June, A. D. 1951.

[SEAL]

THOMAS F. MURPHY,
*Assistant Commissioner of Patents.*